(12) United States Patent
Koch

(10) Patent No.: US 7,327,147 B2
(45) Date of Patent: Feb. 5, 2008

(54) DEVICE AND METHOD FOR DETERMINING CHARACTERISTIC VARIABLES FOR BATTERIES

(75) Inventor: Ingo Koch, Hameln (DE)

(73) Assignee: VB Autobatterie GmbH & Co. KGaA, Hannover (DE)

( * ) Notice: Subject to any disclaimer, the term of this patent is extended or adjusted under 35 U.S.C. 154(b) by 426 days.

(21) Appl. No.: 11/051,503

(22) Filed: Feb. 4, 2005

(65) Prior Publication Data
US 2005/0189948 A1    Sep. 1, 2005

(30) Foreign Application Priority Data
Feb. 4, 2004    (DE)    ........... 10 2004 005 478

(51) Int. Cl.
*G01N 27/416* (2006.01)
(52) U.S. Cl. .............. 324/427; 324/425; 324/432; 429/50; 429/90; 429/91; 429/92
(58) Field of Classification Search ........... 324/425, 324/427, 430, 432, 434; 429/50, 90, 91, 429/92; 320/118, 119
See application file for complete search history.

(56) References Cited

U.S. PATENT DOCUMENTS

| | | |
|---|---|---|
| 3,906,329 A | 9/1975 | Bader |
| 4,153,867 A | 5/1979 | Jungfer et al. |
| 4,193,025 A | 3/1980 | Frailing et al. |
| 4,207,611 A | 6/1980 | Gordon |
| 4,322,685 A | 3/1982 | Frailing et al. |
| 4,595,880 A | 6/1986 | Patil |
| 4,642,600 A | 2/1987 | Gummelt et al. |
| 4,659,977 A | 4/1987 | Kissel et al. |

(Continued)

FOREIGN PATENT DOCUMENTS

DE    2 242 510 C3    4/1974

(Continued)

OTHER PUBLICATIONS

Baert, D & Vervaet, A., "Lead-Acid Battery Model for the Derivation of Peukert's Law," Electrochimica Acta, Elsevier Science Publishers, Barking, GB, vol. 44, No. 20, pp. 3491-3504 XP004168624 ISSN: 0013-4686.

(Continued)

*Primary Examiner*—Karl Easthom
*Assistant Examiner*—Ramy Ramadan
(74) *Attorney, Agent, or Firm*—Foley & Lardner LLP

(57) ABSTRACT

A method for determining characteristic variables for electrical states of an energy storage battery includes subdividing an electrolyte volume of the battery into at least two electrolyte volume components with associated electrolyte balancing areasabd defining at least two electrode plate balancing areas by subdividing the total resistance of electrode plates in the battery into resistance components for the defined electrode plate balancing areas and by subdividing the total energy storage capacity of the electrode plates into energy storage capacity components for the defined electrode plate balancing areas. The method further includes determining the electrolyte concentration of the electrolyte volume components for the defined electrolyte balancing areas and determining the amounts of charge which are held in the electrode plates in each of the electrode plate balancing areas. At least one characteristic variable for associated electrical states of the battery is determined using a mathematical model.

19 Claims, 6 Drawing Sheets

U.S. PATENT DOCUMENTS

| | | |
|---|---|---|
| 4,665,370 A | 5/1987 | Holland |
| 4,719,427 A | 1/1988 | Morishita et al. |
| 4,816,736 A | 3/1989 | Dougherty et al. |
| 4,876,513 A | 10/1989 | Brilmyer et al. |
| 4,888,716 A | 12/1989 | Ueno |
| 4,937,528 A | 6/1990 | Palanisamy |
| 4,943,777 A | 7/1990 | Nakamura et al. |
| 4,952,861 A | 8/1990 | Horn |
| 5,002,840 A | 3/1991 | Klebenow et al. |
| 5,032,825 A | 7/1991 | Kuznicki |
| 5,055,656 A | 10/1991 | Farah et al. |
| 5,079,716 A | 1/1992 | Lenhardt et al. |
| 5,130,699 A | 7/1992 | Reher et al. |
| 5,159,272 A | 10/1992 | Rao et al. |
| 5,162,164 A | 11/1992 | Dougherty et al. |
| 5,204,610 A | 4/1993 | Pierson et al. |
| 5,223,351 A | 6/1993 | Wruck |
| 5,280,231 A | 1/1994 | Kato et al. |
| 5,281,919 A | 1/1994 | Palanisamy |
| 5,316,868 A | 5/1994 | Dougherty et al. |
| 5,321,627 A | 6/1994 | Reher |
| 5,352,968 A | 10/1994 | Reni et al. |
| 5,381,096 A | 1/1995 | Hirzel |
| 5,404,129 A | 4/1995 | Novak et al. |
| 5,412,323 A | 5/1995 | Kato et al. |
| 5,416,402 A | 5/1995 | Reher et al. |
| 5,428,560 A | 6/1995 | Leon et al. |
| 5,439,577 A | 8/1995 | Weres et al. |
| 5,488,283 A | 1/1996 | Dougherty et al. |
| 5,549,984 A | 8/1996 | Dougherty |
| 5,552,642 A | 9/1996 | Dougherty et al. |
| 5,563,496 A | 10/1996 | McClure |
| 5,572,136 A | 11/1996 | Champlin |
| 5,578,915 A | 11/1996 | Crouch, Jr. et al. |
| 5,656,915 A | 8/1997 | Eaves |
| 5,680,050 A | 10/1997 | Kawai et al. |
| 5,698,965 A | 12/1997 | York |
| 5,721,688 A | 2/1998 | Bramwell |
| 5,744,963 A | 4/1998 | Arai et al. |
| 5,761,072 A | 6/1998 | Bardsley, Jr. et al. |
| 5,773,977 A | 6/1998 | Dougherty |
| 5,808,367 A | 9/1998 | Akagi et al. |
| 5,808,445 A | 9/1998 | Aylor et al. |
| 5,818,116 A | 10/1998 | Nakae et al. |
| 5,818,333 A | 10/1998 | Yaffe et al. |
| 5,896,023 A | 4/1999 | Richter |
| 5,898,292 A | 4/1999 | Takemoto et al. |
| 5,936,383 A | 8/1999 | Ng et al. |
| 5,965,954 A | 10/1999 | Johnson et al. |
| 5,977,654 A | 11/1999 | Johnson et al. |
| 5,990,660 A | 11/1999 | Meissner |
| 6,016,047 A | 1/2000 | Notten et al. |
| 6,037,749 A | 3/2000 | Parsonage |
| 6,037,777 A | 3/2000 | Champlin |
| 6,057,666 A | 5/2000 | Dougherty et al. |
| 6,087,808 A | 7/2000 | Pritchard |
| 6,091,325 A | 7/2000 | Zur et al. |
| 6,118,252 A | 9/2000 | Richter |
| 6,118,275 A | 9/2000 | Yoon et al. |
| 6,144,185 A | 11/2000 | Dougherty et al. |
| 6,160,382 A | 12/2000 | Yoon et al. |
| 6,222,341 B1 | 4/2001 | Dougherty et al. |
| 6,268,712 B1 | 7/2001 | Laig-Horstebrock et al. |
| 6,271,642 B1 | 8/2001 | Dougherty et al. |
| 6,296,593 B1 | 10/2001 | Gotou et al. |
| 6,300,763 B1 | 10/2001 | Kwok |
| 6,304,059 B1 | 10/2001 | Chalasani et al. |
| 6,331,762 B1 | 12/2001 | Bertness |
| 6,369,578 B1 | 4/2002 | Crouch, Jr. et al. |
| 6,388,421 B2 | 5/2002 | Abe |
| 6,388,450 B2 | 5/2002 | Richter et al. |
| 6,392,389 B1 | 5/2002 | Kohler |
| 6,392,414 B2 | 5/2002 | Bertness |
| 6,392,415 B2 | 5/2002 | Laig-Horstebrock et al. |
| 6,417,668 B1 | 7/2002 | Howard et al. |
| 6,424,157 B1 | 7/2002 | Gollomp et al. |
| 6,441,585 B1 | 8/2002 | Bertness |
| 6,445,158 B1 | 9/2002 | Bertness et al. |
| 6,452,361 B2 | 9/2002 | Dougherty et al. |
| 6,472,875 B1 | 10/2002 | Meyer |
| 6,495,990 B2 | 12/2002 | Champlin |
| 6,507,194 B2 | 1/2003 | Suzuki |
| 6,515,452 B2 | 2/2003 | Choo |
| 6,515,456 B1 | 2/2003 | Mixon |
| 6,522,148 B2 | 2/2003 | Ochiai et al. |
| 6,534,992 B2 | 3/2003 | Meissner et al. |
| 6,556,019 B2 | 4/2003 | Bertness |
| 6,600,237 B1 | 7/2003 | Meissner |
| 6,600,293 B2 | 7/2003 | Kikuchi |
| 6,608,482 B2 | 8/2003 | Sakai et al. |
| 6,653,818 B2 | 11/2003 | Laig-Horstebrock et al. |
| 2002/0008495 A1 | 1/2002 | Dougherty et al. |
| 2002/0026252 A1 | 2/2002 | Wruck et al. |
| 2002/0031700 A1 | 3/2002 | Wruck et al. |
| 2003/0047366 A1 | 3/2003 | Andrew et al. |
| 2003/0082440 A1 | 5/2003 | Mrotek et al. |
| 2003/0142228 A1 | 7/2003 | Flach et al. |
| 2003/0236656 A1 | 12/2003 | Dougherty |
| 2004/0021468 A1 | 2/2004 | Dougherty et al. |

FOREIGN PATENT DOCUMENTS

| | | |
|---|---|---|
| DE | 39 01 680 A1 | 3/1990 |
| DE | 40 07 883 A1 | 9/1991 |
| DE | 44 14 134 A1 | 11/1994 |
| DE | 43 39 568 A1 | 5/1995 |
| DE | 689 24 169 T2 | 3/1996 |
| DE | 195 43 874 A1 | 5/1996 |
| DE | 197 50 309 A1 | 5/1999 |
| DE | 691 31 276 T2 | 12/1999 |
| DE | 198 47 648 A1 | 4/2000 |
| DE | 694 23 918 T2 | 8/2000 |
| DE | 199 52 693 A1 | 5/2001 |
| DE | 199 60 761 C1 | 5/2001 |
| DE | 93 21 638 U1 | 8/2001 |
| DE | 100 21 161 A1 | 10/2001 |
| DE | 101 03 848 A1 | 8/2002 |
| DE | 699 00 638 T2 | 8/2002 |
| DE | 102 16 637 B3 | 1/2004 |
| EP | 1 116 958 A2 | 7/2001 |
| EP | 1 120 641 A2 | 8/2001 |
| WO | WO 99/17128 | 4/1999 |
| WO | WO 9966340 | 12/1999 |
| WO | WO 00/04620 | 1/2000 |
| WO | WO 0115023 | 3/2001 |
| WO | WO0115023 A1 * | 3/2001 |
| WO | WO 03/001224 | 1/2003 |

OTHER PUBLICATIONS

Battery Alert, Ltd., Battery Deterioration Warning Device, 12 Volt Model (BA101) Advertisement (2 sheets).

Battery Evaluation Reports, s.e. Ross Laboratories, Inc., Apr. 1999 (1 page).

Bosch and the New E-Class, Electronic Battery Management System, Focus on Electonics, Nov. 2002 (1 sheet).

Brooke, L., Resin Keeps Batteries Cool, A1 Inside Magazine, Nov. 1998, p. 55.

Conference Proceedings, Intelec '86—International Telecommunications Energy Conference, Determining the End of Battery Life—Sheldon DeBardelaben, New York Telephone Company, bearing a designation "Oct. 19-22, 1986." (6 sheets).

Forecast Review, The Battery Man, Nov. 1996 p. 21.

Hoover, J. Failure Modes of Batteries Removed from Service, A Presentation at the 107th Convention of Battery Council International, Apr. 30-May 3, 1995, p. 62.

How It Works: Reed Switch Motor, http://members.tripod.com/simplemotor/rsmotor.htm, available at least by Jan. 6, 2003, 4 pages.

HSR-003 Application Notes, Hermetic Switch, Inc., Highway 92, Post Office Box 2220, Chickasha, OK 73023, http://www.hermeticswitch.com/RS_frm.htm, available at least by Jan. 6, 2003 (1 page).

Intelec ' 88—Tenth International communications Energy Conference, "A look at the Impedance of a Cell—S.L. DeBardelaben, New York Telephone Company," bearing a designation "Oct. 30-Nov. 2, 1988." (6 sheets).

International Search Report for PCT/US02/19760 (International filing date Jun. 21, 2002), date of mailing Oct. 10, 2002.

Journal of Applied Electrochemistry, vol. 10 No. 1, Jan. 1980—The Impedance of Electrical Storage Cells—N.A. Hampson, s.A.G.R. Karunathilaka, Department of Chemistry, R. Leek, Department of Electronic and Electrical Engineering, University of Technology, Loughborough, Liecestershire, UK (11 sheets).

Lehman, A., "Electrical Battery Model For Leo Application Based on Absolute Instantaneous State of Charge," Proceedings of the European Space Power Conference held in Madrid, Spain, Oct. 2-6, 1989, ESA Publications, NL, vol. 1, pp. 173-178.

Lürkens et al., Ladezustandsschätzuntt von Bleibatterien mit Hilfe des *Kalman*-Filters, etz Archiv, vol. 8 (1986), Issue 7, pp. 231-236.

Mauracher, P. & Karden, E., "Dynamic Modelling of Lead/Acid Batteries Using Impedance Spectroscopy for Parameter Identification," Journal of Power Sources, Elsevier Sequoia S.A., Lausanne, Ch., vol. 67 (1997) No. 1-2, pp. 69-84, XP004095174 ISSN: 0378-7753, p. 70, line 11; p. 82, line 5, figures 2, 3, 12.

Mayer, D. et al., "Modelling and Analysis of Lead Acid Battery Operation," Ecole des Mines de Paris, XP010092137, pp. 1-3.

OnGuard™ XT Battery State-of-Health Monitor, 2003 Midtronics, Inc. P/N 156-983A (2 sheets).

Reed Relay Technical & Applications Information, COTO Technology, 55 Dupont Drive, Providence, RI, pgs. http://www.cotorelay.com/ReedTech.pdf, available at least by Jan. 6, 2003, 37-43.

Robbins, Tim & Hawkins, John, "Battery Model For Over-Current Protection Simulation of DC Distribution Systems," Telecommunications Energy Conference, 1994, Intelec '94, 16th International Vancouver, BC, Canada Oct. 30-Nov. 3, 1994, New York, NY, IEEE, pp. 307-314 XP001036407 ISBN: 0-7803-2034-4.

Stan Gibilisco and Neil Sclater, Co-Editors-in-Chief, "Rectifier Bridge," Encyclopedia of Electronics, 2nd Edition, TAB Professional and Reference Books, 1996, pp. 708-711.

Willibert Schleuter, Das elektrische Ersatzschaltbild des Bleiakkumulators unter Berücksichtigung erzwungener Elektrolytströmung, etz Archiv, vol. 4 (1982), Issue 7, pp. 213-218.

Mattera, F. et al., "Characterisation of photovoltaic batteries using radio element detection: the influence and consequences of the electrolyte stratification," Journal of Power Sources, Jan. 27, 2003, pp. 400-407, vol. 113, Elsevier Science B.V.

Desmettre, D. et al., "Experimental Study of Stratification of Electrolyte in Lead/Acid Batteries Used for Solar Energy," 2nd World Conference and Exhibition on Photovoltaic Solar Energy Conversion, Jul. 6-10, 1998, pp. 2135-2138, PV Modules and Components of PV Systems, Vienna, Austria.

European Search Report for Application No. EP 05 00 0566, dated Jun. 1, 2005, 3 pages.

* cited by examiner

DEVICE AND METHOD FOR DETERMINING CHARACTERISTIC VARIABLES FOR BATTERIES

CROSS-REFERENCE TO RELATED PATENT APPLICATIONS

The present application claims the benefit under 35 U.S.C. § 119 of German Application DE 10 2004 005 478.9-34, filed Feb. 4, 2004. German Application DE 10 2004 005 478.9-34, including the specification, drawings, claims and abstract, is incorporated herein by reference in its entirety.

BACKGROUND

The present invention relates to a method for determining characteristic variables for electrical states of an electrochemical energy storage battery. The present invention also relates to a monitoring device for an electrochemical energy storage battery having an evaluation unit and a measurement unit for measurement of the battery terminal voltage, the battery terminal current, and the battery temperature.

In certain applications, there is a need to determine or predict the instantaneous state of an electrochemical energy storage battery, such as the state of charge or the capability to be loaded with a high current. By way of example, the capability of a starter battery to start a motor vehicle with an internal combustion engine is governed by the state of charge, the state of aging, and the apparent capacity loss of the battery, since the current level which can be drawn from the starter battery and its power output are limited. It may be important to determine the state of charge and the starting capability of a starter battery in situations in which, for example, the engine is being operated intermittently, since the vehicle power supply system together with its loads is still operated during the periods when the engine is stopped, even though the generator is not producing any current. The monitoring of the state of charge and of the starting capability of the energy storage battery must in situations such as these ensure that the energy content of the energy storage battery always remains sufficient to start the engine.

Widely differing methods are known for measurement of the state of charge and for determination of the load behavior of energy storage batteries. For example, integrating instruments (e.g., amp-hour (Ah) counters) are used, with the charging current possibly being taken into account and weighted with a fixed charging factor. Since the usable capacity of an energy storage battery is highly dependent on the magnitude of the discharge current and on the temperature, methods such as these also do not allow any satisfactory statement to be made about the usable capacity which can still be drawn from the battery.

By way of example, it is known from DE 22 42 510 C1 to provide a method for measuring the state of charge in which the charging current is weighted with a factor which is itself dependent on the temperature and on the state of charge of the battery.

DE 40 07 883 A1 describes a method in which the starting capability of an energy storage battery is determined by measuring the battery terminal voltage and the battery temperature, and comparing with a state of charge family of characteristics which is applicable to the battery type to be tested.

DE 195 43 874 A1 discloses a calculation method for the discharge characteristic and remaining capacity measurement of an energy storage battery in which the current, voltage, and temperature are likewise measured, and in which the discharge characteristic is approximated by a mathematical function with a curved surface.

DE 39 01 680 C1 describes a method for monitoring the cold starting capability of a starter battery in which the starter battery is loaded with a resistance at times. The voltage dropped across the resistance is measured and is compared with empirical values to determine whether the cold starting capability of the starter battery is still sufficient. In this case, the starter battery is loaded by the starting process.

Furthermore, DE 43 39 568 A1 discloses a method for determining the state of charge of a motor vehicle starter battery in which the battery current and rest voltage are measured, and the state of charge is deduced from them. In this case, the battery temperature is also taken into account. The charging currents measured during different time periods are compared with one another, and a remaining capacity is determined from them.

DE 198 47 648 A1 describes a method for learning a relationship between the rest voltage and the state of charge of an energy storage battery for the purpose of estimating the storage capability. A measure for the electrolyte capacity of the electrolyte in the energy storage battery is determined from the relationship between the rest voltage difference and the amount of current drawn during the load phase. This makes use of the fact that the rest voltage rises approximately linearly with the state of charge in the higher state of charge ranges which are relevant in practice.

One problem in determining the state of an electrochemical energy storage battery using the already known methods is that wear occurs not only when rechargeable energy storage batteries are being discharged and charged but also when they are stored without any load being applied, and the relevant wear factors are not all considered.

In the case of a lead-acid rechargeable battery, the electrolyte is composed of dilute sulfuric acid, that is to say, a solution of sulfuric acid in water. In the completely charged state, this is typically an approximately 4 to 5 molar solution. During the discharge reaction, sulfuric acid in the electrolyte is consumed at both electrodes on the basis of the reaction equation:

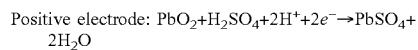

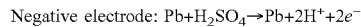

and, furthermore, $H_2O$ is formed at a positive electrode. In consequence, the concentration and the relative density of the electrolyte fall during discharging, while they rise again during the charging reaction, which takes place in the opposite sense.

If the sulfuric acid which is formed during the charging reaction has the capability for convection in the earth's field of gravity, then it has the tendency to fall in layers to the bottom of the cell vessel for the lead-acid rechargeable battery cells. The electrolyte in the lower area of the respective cell vessel thus has a higher concentration than that in the upper area of the cell vessel. In the case of a lead-acid rechargeable battery, this state is referred to as acid stratification.

Since both the charging and discharge reaction as well as the parasitic reactions, such as gas development, corrosion etc., are in general influenced by the electrolyte concentration, acid stratification leads to the cell state not being uniform.

It would be advantageous to provide an improved method for determining characteristic variables for electrical states of an energy storage battery. It would also be advantageous to provide an improved monitoring device.

SUMMARY

The present invention relates to a method for determining characteristic variables for electrical states of an energy storage battery. The method includes subdividing an electrolyte volume of the battery into at least two electrolyte volume components with associated electrolyte balancing areas. The method also includes defining at least two electrode plate balancing areas by subdividing the total resistance of electrode plates in the battery into resistance components for the defined electrode plate balancing areas and by subdividing the total energy storage capacity of the electrode plates into energy storage capacity components for the defined electrode plate balancing areas. The method further includes determining the electrolyte concentration of the electrolyte volume components for the defined electrolyte balancing areas and determining the amounts of charge which are held in the electrode plates in each of the electrode plate balancing areas; and determining at least one characteristic variable for associated electrical states of the battery using a mathematical model for describing an electrical equivalent circuit which utilizes at least the variables of the resistance components, the energy storage capacity components, the electrolyte concentration, and the amounts of charge held.

The present invention also relates to a monitoring device for an electrochemical energy storage battery that includes a measurement unit for measurement of the battery terminal voltage, of the battery terminal current and of the battery temperature and an evaluation unit. The evaluation unit is designed to carry out a method by programming of a microprocessor unit, the method including a method for determining characteristic variables for electrical states of an energy storage battery and including subdividing an electrolyte volume of the battery into at least two electrolyte volume components with associated electrolyte balancing areas. The method also includes defining at least two electrode plate balancing areas by subdividing the total resistance of electrode plates in the battery into resistance components for the defined electrode plate balancing areas and by subdividing the total energy storage capacity of the electrode plates into energy storage capacity components for the defined electrode plate balancing areas. The method also includes determining the electrolyte concentration of the electrolyte volume components for the defined electrolyte balancing areas and determining the amounts of charge which are held in the electrode plates in each of the electrode plate balancing areas. The method further includes determining at least one characteristic variable for associated electrical states of the battery using a mathematical model for describing an electrical equivalent circuit which utilizes at least the variables of the resistance components, the energy storage capacity components, the electrolyte concentration, and the amounts of charge held.

DETAILED DESCRIPTION OF EXEMPLARY EMBODIMENTS

Figure 1:
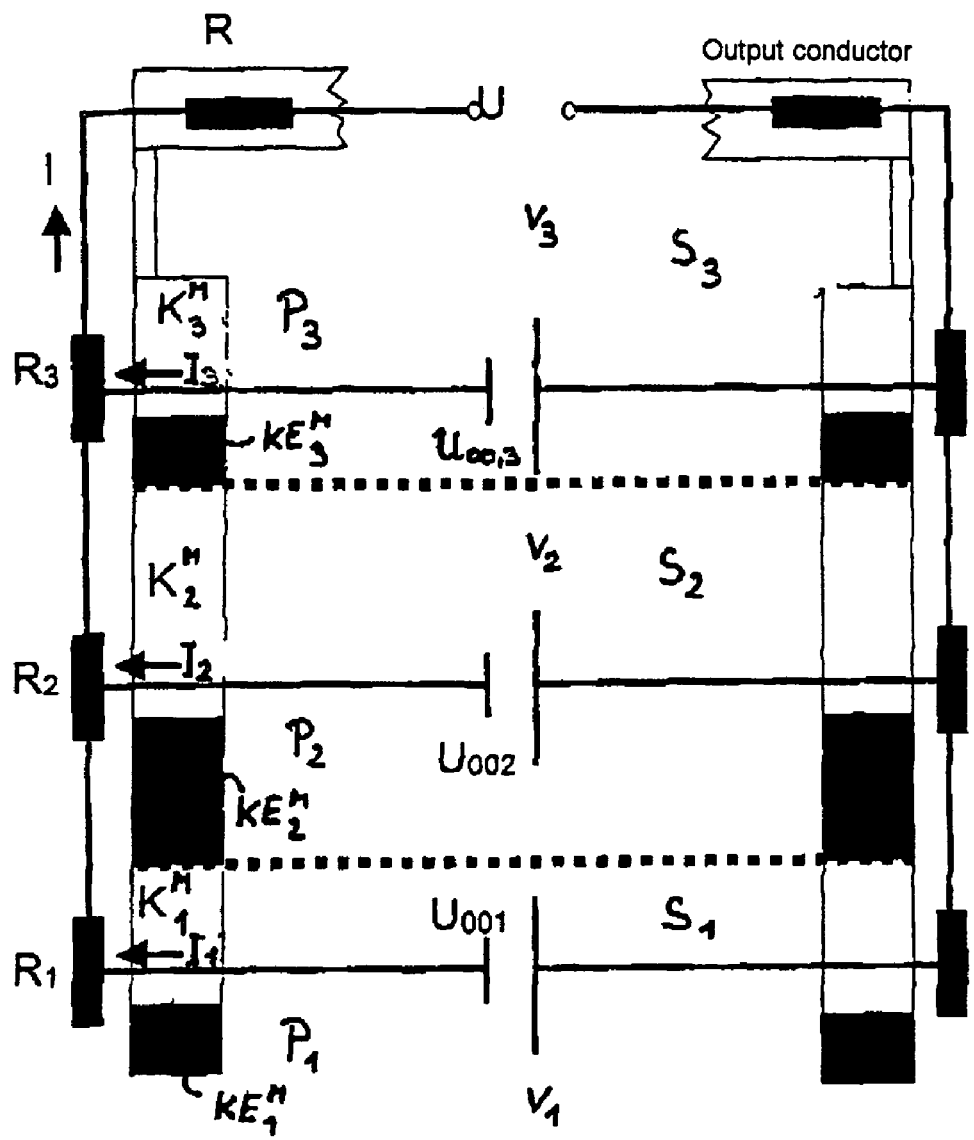
FIG. 1 shows an electrical equivalent circuit of an energy storage battery, which is subdivided into acid balancing areas and electrode plate balancing areas, during discharging.

According to the an exemplary embodiment, a method for determining characteristic variables for electrical states of an energy storage battery includes the following steps: a) the electrolyte volume of the energy storage battery is subdivided into at least two electrolyte volume components with associated electrolyte balancing areas; b) at least two electrode plate balancing areas are defined by subdividing the total resistance of the electrode plates in the energy storage battery into resistance components for the defined electrode plate balancing areas, and the total energy storage capacity of the electrode plates in the energy storage battery into energy storage capacity components for the defined electrode plate balancing areas; c) the electrolyte concentration of the electrolyte volume components for the defined electrolyte balancing areas is determined; d) the amounts of charge which are in each case held in the electrode plates in the electrode plate balancing areas are determined; and e) at least one characteristic variable is determined for associated electrical states of the energy storage battery by means of a mathematical model for describing an electrical equivalent circuit at least by means of the variables of the resistance components, of the energy storage capacity components, of the electrolyte concentration, and of the amounts of charge held.

The subdivision of the energy storage battery into electrolyte balancing areas and electrode plate balancing areas makes it possible to record the complex physical and chemical processes in an energy storage battery, including acid stratification, by means of a mathematical model for describing an electrical equivalent circuit of the energy storage battery, in order to determine characteristic variables for electrical states of energy storage batteries. In this case, the acid density may be a measure of the electrolyte concentration.

It is advantageous for rest voltages to be determined in the defined electrode plate balancing areas as a function of the electrolyte concentration or acid density in an associated electrolyte balancing area. In this case, one electrode plate balancing area is in each case connected to an associated electrolyte balancing area, but not to the other electrolyte balancing areas. The calculation of the rest voltage in one electrode plate balancing area takes account of the fact that this is significantly influenced by the electrolyte concentration in the associated electrolyte balancing area, the amount of charge stored and, possibly, the battery temperature.

It is particularly advantageous for currents for the electrolyte balancing areas to be calculated from the total current flowing to the connecting terminals of the energy storage battery and from a division ratio which is dependent on the electrolyte concentration in the respective electrolyte balancing area. In the same way, currents for the electrode plate balancing areas can be calculated from the total current flowing to the connecting terminals of the energy storage battery and from a division ratio which is dependent on the rest voltage in the respective electrode plate balancing area and the resistance components.

The distribution of the current between the electrolyte and electrode plate balancing areas is preferably weighted in the charging direction as a function of the distribution of the current in the discharge direction, with the currents for the electrolyte balancing areas corresponding during discharging to the currents which have been calculated for the electrode plate balancing areas.

For charging processes, on the other hand, there is a difference between the division ratios for calculation of the currents for the electrolyte balancing area and the division ratios for calculation of the currents for the electrode plate balancing areas.

It is also advantageous to calculate the amount of charge drawn from one electrode plate balancing area in a time period by subtracting the charge which has flowed through the electrode plate balancing area in the time period under consideration from the amount of charge stored in this electrode plate balancing area until immediately before this time period.

The amount of charge which can still be drawn from the electrode plates in the individual electrode plate balancing areas can thus be calculated from the energy storage capacity component of the respective electrode plate balancing area minus the amount of charge which was drawn from the electrode plates in the electrode plate balancing area prior to the time period under consideration, and minus the charge drawn from the electrode plates in the electrode plate balancing area in that time period.

Furthermore, the amounts of charge which can still be drawn from the electrolyte volume components in the individual electrolyte balancing areas can be calculated as a function of the instantaneous electrolyte concentration and the electrolyte volume in the respective electrolyte balancing area, and the battery temperature.

The remaining capacity which can be still be drawn from the energy storage battery is preferably used as a characteristic variable as a function of the amounts of charge determined for the electrode plate balancing areas and can still be drawn for the electrode plates in the respective electrode plate balancing areas, and as a function of the amounts of charge which have been determined for the electrolyte balancing areas and can still be drawn from the electrolyte volume components in the respective electrolyte balancing areas.

The rest voltage of the energy storage battery can also be calculated as a characteristic variable, as a function of the amount of charge stored, possibly with respect to the energy storage capacity in the individual electrode plate balancing areas, of the rest voltages in the electrode plate balancing areas, of the resistance components, of the polarization resistance and the charge reversal current by charge reversal on in each case one individual electrode plate. The charge reversal current to be taken into account occurs as a result of the active material being discharged at the point where the rest voltage is high, and by charging taking place at the point where the rest voltage is relatively low. This is associated with a voltage drop across the polarization resistance, which represents the polarization resistance at the plate surface for small currents, and the individual grid resistances of the electrode plate grids. This results in a rest voltage whose value is between the rest voltages of the individual balancing areas (mixed potential).

It is thus advantageous to determine the characteristic variable as a function of the charge reversal current on the electrode plates between points where the rest voltage is relatively high and points where the rest voltage is low, with the charge reversal current being calculated from the polarization resistance on the electrode plate surfaces and the sum of the grid resistances between those points, using the formula:

$$I_U = (U_{00,x} - U_{00,y}) \cdot \left( R_{P,x} + R_{P,y} + \sum_{n=x}^{y} R_n \right)$$

It is also advantageous to determine the critical temperature for the start of ice crystal formation in the balancing areas as a function of the electrolyte concentration in the electrolyte balancing areas, the temperature and the electrolyte volume components. In this case, the ice crystal volume in the electrolyte balancing areas can be calculated from a defined relationship between the equilibrium concentration of the acid in the electrolyte and the temperature as well as the acid concentration in the electrolyte using the formula:

$$v_{ice,i} = (1 - C_f/CGG_i) \cdot v_i$$

The ice formation in different zones can thus be assessed by consideration of individual balancing areas and calculation of the acid density in these balancing areas. The information about the volume of ice in each electrolyte balancing area makes it possible to state whether the performance of the energy storage battery is being adversely affected by the ice. This can be done in such a way, for example, that, when ice crystals occur only in the upper electrolyte balancing area, it is assumed that the battery will have its full performance while, in contrast, it is assumed that the battery will no longer be as powerful when ice crystals occur in the lowermost electrolyte balancing area.

It is also advantageous to adapt the state values for the electrolyte concentration in the electrolyte balancing areas as a function of the difference between the actual rest voltage and the calculated rest voltage. This takes account, for example, of any mixing of the acid caused by movement of the battery, which cannot be taken into account in the model since only the battery terminal current and the battery terminal voltage are measured.

Owing to the fact that outer areas of the energy storage battery may have a different behavior, it is also advantageous for separate electrolyte balancing areas, which are weighted separately to the other electrolyte balancing areas, to be assigned to outer areas.

Figure 2:
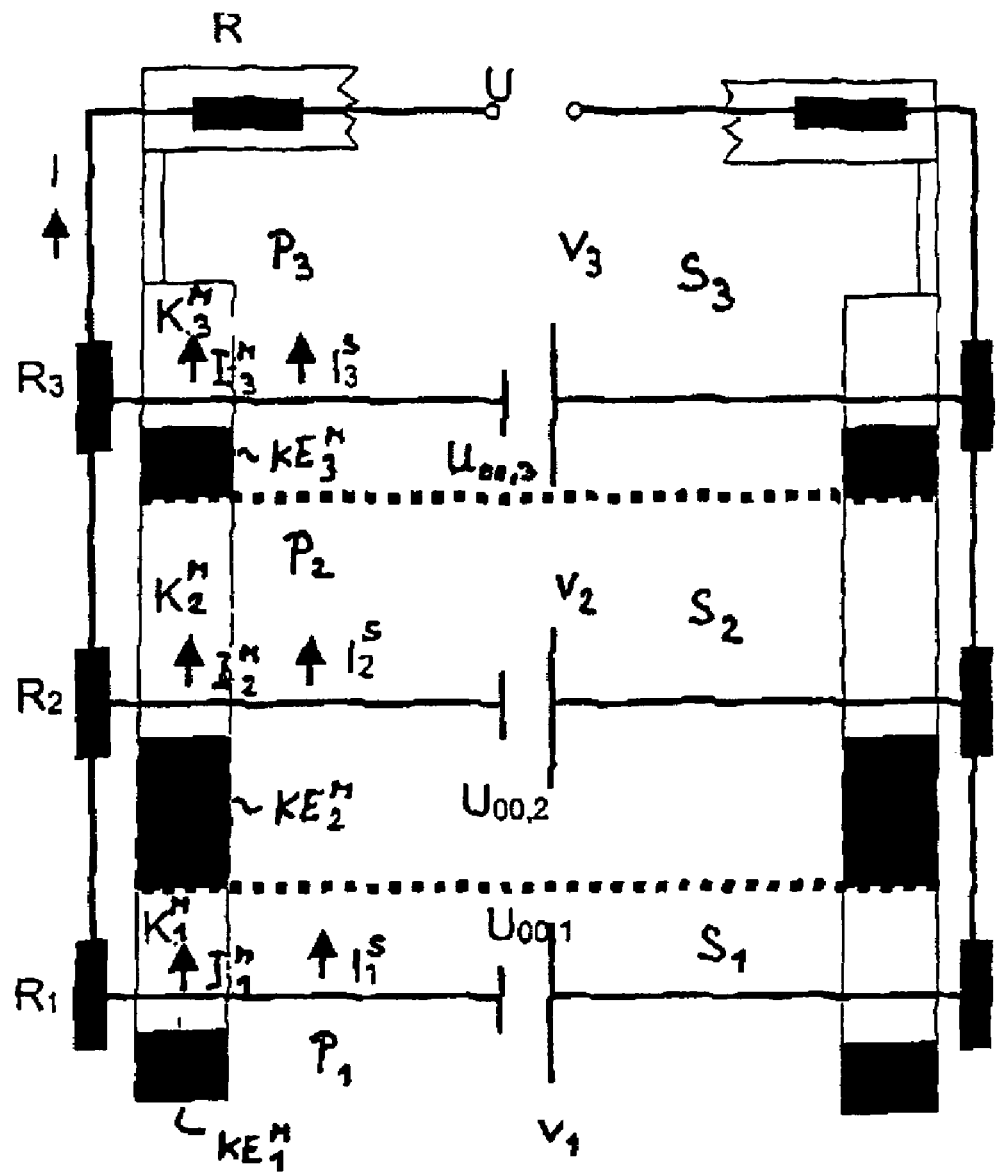
FIG. 2 shows an electrical equivalent circuit of the energy storage battery shown in FIG. 1, with the currents associated with the acid balancing areas and the electrode plate balancing areas, during charging.

FIGS. 1 and 2 show an electrical equivalent circuit of an energy storage battery during charging and discharging, which is subdivided into three electrolyte balancing areas $S_1$, $S_2$ and $S_3$, which are located horizontally one above the other, with the respective electrolyte volume components $v_1$, $v_2$ and $v_3$. Furthermore, the energy storage battery is subdivided horizontally in the same way into three electrode plate balancing areas $P_1$, $P_2$ and $P_3$, which are located one above the other, for the electrode plates. For this purpose, the total energy storage capacity $K^M$ of the electrode plates in the energy storage battery is subdivided into three energy storage capacity components $K_1^M$, $K_2^M$ and $K_3^M$. In addition, the grid resistances $R_1$, $R_2$ and $R_3$ (which occur in these areas) of the electrode plate grids are associated with the individual electrode plate balancing areas $P_1$, $P_2$ and $P_3$. The resistance R represents the output conductor resistance.

The subdivision of the electrolyte balancing areas $S_i$ and electrode plate balancing areas $P_k$, where $i=1$ to 3 and $k=1$ to 3, results in only the electrode plate balancing area $P_1$ being connected to the electrolyte balancing area $S_1$. In a corresponding manner, only the electrode plate balancing area $P_2$ is connected to the electrolyte balancing area $S_2$, and only the electrode plate balancing area $P_3$ is connected to the electrolyte balancing area $S_3$.

As can also be seen, a charging and discharge current $I_1$, $I_2$ and $I_3$ can be associated with the respectively associated electrolyte balancing areas $S_i$ and electrode plate balancing areas $P_k$, and the sum of these currents corresponds to the total current I flowing to the connecting terminals of the energy storage battery. This total current I as well as the terminal voltage U of the energy storage battery can be measured very easily throughout the life of the energy storage battery, and can be used as an input variable for determination of the characteristic variables for electrical states of the energy storage battery.

FIGS. 1 and 2 also show that amounts of charge $KE_k^M$ which, at most, can assume the value of the respective energy storage capacity component $K_k^M$ can be drawn from the respective electrode plate balancing area $P_k$.

When the energy storage battery is being charged, as is sketched in FIG. 1, the distribution of the total current I is separate in the charging direction for the electrolyte balancing areas $S_i$ and the electrode plate balancing areas $P_K$. This is because the reduction in the more concentrated sulfuric acid in the energy storage battery in the downward direction results in additional charging of the electrolyte volume components $v_1$, $v_2$ in the electrolyte balancing areas $S_1$, $S_2$ at the bottom. Mathematically, this can be regarded as an additional current flow. For the sake of simplicity, this effect is dealt with as if the electrolyte balancing areas $S_i$ had a different charging current $I_i^S$ applied to them.

The charging current components $I_i^S$ for the electrolyte balancing areas $S_i$ are calculated as follows:

$$I_i^S = \frac{q_i}{\sum_{n=1}^{N} q_n} \cdot I$$

$$I_N^S = I - \sum_{n=1}^{N-1} I_n^S$$

where N represents the number of electrolyte balancing areas, and q represents the division factors.

The equation system for the three electrolyte balancing areas $S_1$, $S_2$ and $S_3$ is illustrated by way of example as follows:

$$I_1^S = \frac{q_1}{(q_1 + q_2 + q_3)} \cdot I$$

$$I_2^S = \frac{q_2}{(q_1 + q_2 + q_3)} \cdot I$$

$$I_3^S = I - I_1^S - I_2^S$$

The following equations apply to the division factors $q_i$:

$$q_1 = c_1 \cdot (r_L - r_1) \cdot \max\left(\frac{KE_3^M}{K_3^M}, \frac{KE_2^M}{K_2^M}, \frac{KE_1^M}{K_1^M}\right)$$

$$q_2 = c_2 \cdot (r_L - r_2) \cdot \max\left(\frac{KE_3^M}{K_3^M}, \frac{KE_2^M}{K_2^M}\right)$$

$$q_3 = c_3 \cdot (r_L - r_3) \cdot \left(\frac{KE_3^M}{K_3^M}\right)$$

The variables $c_1$ to $c_3$ are empirical constants which must be determined experimentally for each energy storage battery type. The variable $r_L$ is the acid density which is formed on the electrode plates during charging. For simplicity, this is assumed to be constant and has a typical value of 1.46 g/cm$^3$.

The values $r_1$ to $r_3$ are the acid densities in the electrolyte balancing areas $S_1$, $S_2$ and $S_3$. The values ($KE_k^M$) are the amounts of charge which are drawn from the respective electrode plate balancing area $P_k$ and which, at most, can assume the value of the energy storage capacity components $K_k^M$ defined by the subdivision of the energy storage battery.

The amounts of charge $KE_k^M$ which are drawn are reduced, for a time period dt under consideration, by the current component $I_k^M$, integrated over the time period dt, of the respective electrode plate balancing area $P_k$. If the current component $I_k^M$ is assumed to be constant for the time period dt, the value of the amount of charge drawn $KE_k^M$ is given by:

$$KE_k^M(t_1+dt) = KE_k^M(t_1) + I_k^M \cdot dt$$

where $t_1$ is the start of the time period dt. In the initial state after the energy storage battery has been brought into use for the first time, the amount of charge drawn is calculated to be:

$$KE_k^M(t_0) = K_k^M + I_k^M \cdot dt.$$

These current components $I_k^M$ for the electrode plate balancing areas $P_k$, that is to say the currents flowing in the electrode plates and solid masses, are described as follows:

$$I_k^M = \frac{d_k^L}{\sum_{n=1}^{N-1} d_n^L} \cdot I \quad \text{and}$$

$$I_N^M = I - \sum_{n=1}^{N-1} I_n^M$$

where N is the number of electrode plate acid balancing areas $P_k$, and $d_n^L$ are division factors.

The equation system for three electrode plate balancing areas $P_1$, $P_2$, $P_3$ is as follows:

$$I_1^M = \frac{d_1^L}{d_1^L + d_2^L + d_3^L} \cdot I$$

$$I_2^M = \frac{d_2^L}{d_1^L + d_2^L + d_3^L} \cdot I$$

$$I_3^M = I - I_1^M - I_2^M.$$

In this case, the division factors $d_k^K$ are as follows:

$$d_1^L = \frac{U_{00,1} - U}{R_1/2 + R_2 + R_3 + R} \cdot f_L(KE_1^M, K_1^M)$$

$$d_2^L = \frac{U_{00,2} - U}{R_2/2 + R_3 + R} \cdot f_L(KE_2^M, K_2^M)$$

$$d_3^L = \frac{U_{00,3} - U}{R_3/3 + R} \cdot f_L(KE_3^M, K_3^M)$$

where U is the total battery voltage related to one cell, measured at the connecting terminals of the energy storage battery.

The rest voltages $U_{00,k}$ on the respective electrode plate balancing areas $P_k$ are a function of the acid density $r_i$ in the associated electrolyte balancing areas $S_i$ and the battery temperature T.

Figure 3:
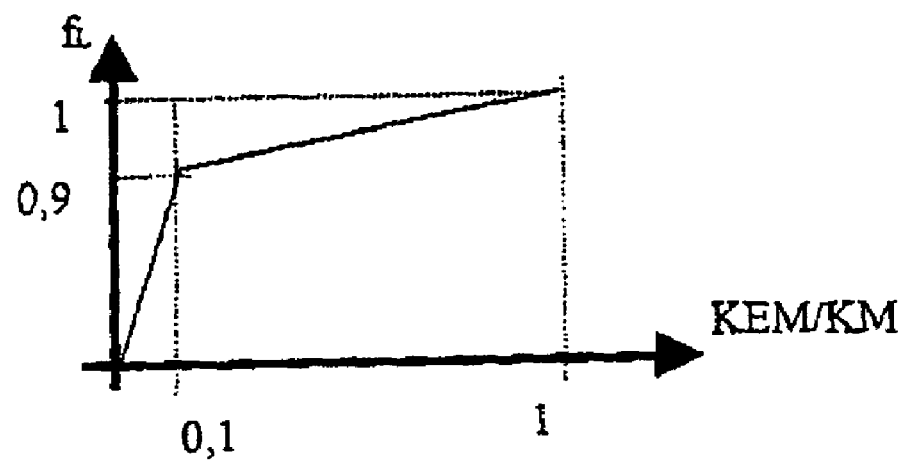
FIG. 3 shows a graph of a function $f_L$ as a function of the amount of charge drawn, related to an energy storage capacity component, in an electrode plate balancing area in order to calculate the charging current distribution in the electrode plate balancing areas.

FIG. 3 sketches an example of a function $f_L$ as a function of the amount of charge $KE_k^M$ drawn, related to the energy storage capacity component $K_k^M$ in an electrode plate balancing area $P_k$. Up to a ratio of $KE_k^M$ of 0.1, the function $f_L$ rises linearly and steeply to the value 0.9. After this, the value of the function $f_L$ rises linearly and slowly to the value 1 until a ratio $$\frac{KE_k^M}{K_k^M} = 1$$

is reached.

During discharging, the total current I in the electrode plate balancing areas $P_k$ is calculated in a similar manner to that described above, but using a different function $f_E$ for the relationship between the amount of charge $KE_k^M$ drawn and the energy storage capacity components $K_k^M$:

$$I_1^M = \frac{d_1^E}{d_1^E + d_2^E + d_3^E} \cdot I$$

$$I_2^M = \frac{d_2^E}{d_1^E + d_2^E + d_3^E} \cdot I$$

$$I_3^M = I - I_1^M - I_2^M.$$

In this case, the division factors $d_k^E$ are as follows:

$$d_1^E = \frac{U_{00,1} - U}{R_1/2 + R_2 + R_3 + R} \cdot f_E(KE_1^M, K_1^M)$$

$$d_2^E = \frac{U_{00,2} - U}{R_2/2 + R_3 + R} \cdot f_E(KE_2^M, K_2^M)$$

$$d_3^E = \frac{U_{00,3} - U}{R_3/3 + R} \cdot f_E(KE_3^M, K_3^M).$$

The values for the amounts of charge $KE_k^M$ drawn are calculated as described above by reduction by the current component $I_k^M$, integrated over the time period dt, for the electrode plate balancing areas $P_k$.

Figure 4:
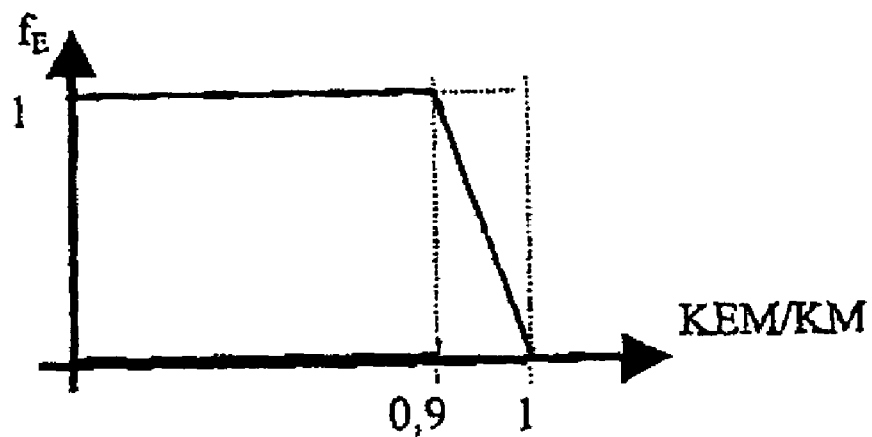
FIG. 4 shows a graph of a function $f_E$ as a function of the amount of charge drawn, related to an energy storage capacity component, in order to calculate the discharge current distribution.

By way of example, FIG. 4 shows the function $f_E$ as a function of the amount of charge $KE_k^M$ drawn related to the energy storage capacity component $K_k^M$. The value for $f_E$ is equal to unity up to a ratio $$\frac{KE_k^M}{K_k^M} = 0.9.$$

The value of $f_E$ falls linearly from unity to a value of 0 in the range from $$\frac{KE_k^M}{K_k^M} = 0.9 \text{ to } 1.$$

During discharging; the current component $I_i^s$ for the electrolyte balancing areas $S_i$ corresponds to the value of the current component $I_k^M$ for the associated electrode plate balancing area $P_k$.

Once current has been drawn or added, the acid density $r_i$ for an electrolyte balancing area $S_i$ is calculated as a function:

$$r_i(t_1 + dt) = f(r_i(t_1), v_i, I_i^s \cdot dt, T).$$

In this case, $r_i$ is the acid density in the electrolyte balancing area $S_i$ before the time period dt, $v_i$ is the electrolyte volume component in the electrolyte balancing area $S_i$, T is the temperature of the energy storage battery, and $I_i^s \cdot dt$ is the charge added to or drawn from the electrolyte balancing area $S_i$ in the time period dt.

By way of example, the amount of charge which can still be drawn from the energy storage battery can be calculated as a characteristic variable for states of the energy storage battery, in order to estimate the remaining capacity of the energy storage battery.

For this purpose, the amount of charge $RK_k^M$ (remaining capacity) which can still be drawn from the active mass is calculated for each electrode plate balancing area $P_k$ using:

$$RK_k^M = K_k^M - (KE_k^M + I_k^M \cdot dt).$$

The amount of charge $RK_i^s$ which can be drawn from the corresponding electrolyte balancing area $S_i$ is then calculated as a function of the electrolyte volume $v_i$ and the instantaneous acid density $r_i$ in the electrolyte balancing area $S_i$, as well as the temperature T of the energy storage battery, using the function:

$$RK_i^s = f(v_i, r_i, T).$$

The amount of charge $RK_g$ which can still be drawn from the energy storage battery is calculated on the basis of the amount of charge $RK_k^M$ which can be drawn in the electrode plate balancing areas $P_k$ and the amount of charge $RK_i^s$ which can be drawn in the electrolyte balancing areas $S_i$, with the following situation distinction which is necessary to take account of the "drop-off" of higher density acid from an upper balancing area to a lower balancing area. This is based on the assumption that complete discharging takes place first of all in the lower area of the energy storage battery, then in the central area, and finally at the top.

a) If $RK_1^s < RK_1^M$:

Missing acid capacity is taken at most from the electrolyte volume $v_2$ until the acid in the electrolyte volume $v_2$ has been consumed. The acid capacity $RK_2^s$ in the electrolyte volume $v_2$ is reduced corresponding to the acid consumed in the electrolyte volume $v_1$. $RK_1^s$ is thus increased.

b) If $RK_2^s < RK_2^M$:

Missing acid capacity is taken at most from the electrolyte volume $v_3$ until the acid in the electrolyte volume $v_3$ has been consumed. The acid capacity $RK_3^s$ in the electrolyte volume $v_3$ is reduced corresponding to the acid consumed in the electrolyte volume $v_2$. The new value for $RK_2^s$ can then be calculated using step a).

This then results in $$RK_8 = \sum_{k=1}^{N} \min(RK_k^s, RK_k^M)$$

The rest voltage $U_{00,g}$ of the energy storage battery can be calculated from the individual rest voltage levels $U_{00,k}$ of the balancing areas $S_i$, $P_k$ as a further characteristic variable for the state of the energy storage battery. In this case, however, it is also necessary to take account of the charge reversal current $I_U$ from points where the rest voltage $U_{00}$ is relatively high to points where the rest voltage $U_{00}$ is low on the same electrode plate. This charge reversal current $I_U$ is a result of the active material at the point where the rest voltage $U_{00}$ is high being discharged, and charging taking place at the point where the rest voltage $U_{00}$ is relatively low. This is associated with a voltage drop across the polarization resistance $R_p$, which represents the polarization resistance on the plate surface when the currents are low, and the individual grid resistances $R_k$. This results in a rest voltage $U_{00}$ whose value is between the rest voltages $U_{00,k}$ of the individual balancing areas $S_i$, $P_k$ (mixed potential).

The charge reversal current $I_U$ is calculated as follows:

$$I_U = (U_{00,x} - U_{00,y}) \cdot \left( R_{P,x} + R_{P,y} + \sum_{n=x}^{y} R_n \right)$$

The total rest voltage $U_{00,g}$ of the energy storage battery is calculated as follows:

$$U_{00,g} = U_{00,x} - I_U \cdot \left( R_{P,x} + \sum_{n=x}^{y} R_n \right)$$

If appropriate, the charge reversal current $I_U$ and the total rest voltage $U_{00,g}$ must be related to the number of cells.

The indices x, y for the rest voltage $U_{00,x}$, $U_{00,y}$ relate to a respective electrode plate balancing area $P_k$, with a case distinction being made since a charge reversal current $I_U$ can flow only when the point at which the rest voltage $U_{00}$ is relatively high still has mass which can be discharged, and the point where the rest voltage $U_{00}$ is relatively low still has mass which can be charged. The case distinction is as follows:

a) $K_1^M$ is partially charged or fully charged, $K_3^M$ is partially charged or discharged, and $K_2^M$ is irrelevant:
X=1, Y=3
$R_i = R_1/2 + R_2 + R_3/2$ b) $K_1^M$ is partially charged or fully charged, $K_2^M$ is partially charged or discharged, and $K_3^M$ is fully charged:
X=1, Y=2
$R_i = R_1/2 + R_2/2$ c) $K_2^M$ is partially charged or fully charged, $K_3^M$ is partially charged or discharged, and $K_1^M$ is discharged:
X=2, Y=3
$R_i = R_2/2 + R_3/2$ d) $K_1^M$ is fully charged or discharged, and $K_2^M$ and $K_3^M$ are fully charged:
$U_{00,g} = U_{00,1}$ e) $K_2^M$ is fully charged or partially charged, $K_1^M$ is discharged, and $K_3^M$ is fully charged:
$U_{00,g} = U_{00,2}$ f) all other cases:
$U_{00,g} = U_{00,3}$.

Furthermore, the ice formation can be calculated and assessed as a characteristic variable. This can be done by analysis of individual electrolyte balancing areas $S_i$ and calculation of the acid density $r_i$ in these electrolyte balancing areas $S_i$ for different zones. The temperature T and the acid density $r_i$ can then be used to calculate the volume of ice crystals that has formed in the individual electrolyte balancing areas $S_i$.

Each temperature T has an associated equilibrium concentration CGG of the sulfuric acid in the electrolyte. If the concentration falls below this level, then pure water freezes out and ice crystals are formed until this equilibrium concentration CGG is reached in the rest of the liquid phase of the electrolyte. The volume of ice crystals is then calculated ignoring the volume extent of the water as follows:

$$v_{ice,i} = (1 - C_i / CGG_i) \cdot v_i,$$

where the equilibrium concentration CGG is a defined function of the temperature in the respective electrolyte balancing area $S_i$:

$$CGG_i = f(T_i)$$

$C_i$ is the concentration of sulfuric acid in the electrolyte volume $v_i$, and can be calculated from the acid density $r_i$ and the temperature $T_i$ in the respective electrolyte balancing area $S_i$.

The information about the ice volume $v_{ice}$ in each electrolyte balancing area $S_i$ can then be used to make a statement as to whether the ice crystals are adversely affecting the performance of the energy storage battery. This may be done, for example, in such a way that the battery is assumed to have its full performance when ice crystals occur only in the uppermost electrolyte balancing area $S_i$. In contrast, the energy storage battery is no longer regarded as being powerful when ice crystals occur in the lowermost electrolyte balancing area $S_i$.

In this case, one or more parameters and/or state variables for the battery model can be determined by adaptation of the model results by means of a parameter and/or state estimation method.

For example, the acid density $r_i$ can be matched to measured values. By calculation of the rest voltage $U_{00,g}$ in the model and by comparison with the actual rest voltage $U_{00,g}$ which can be obtained by other methods or can be determined by waiting for a long rest phase, it is possible to make a statement on how well the model is mapping the battery state at that time. For example, movement of the battery may result in the acid being mixed in a way which the model cannot take account of since only the current and voltage are measured. In situations such as this, adaptation must then be carried out. This is done on the basis of the difference between the rest voltage $U_{00,g}$ calculated in the model and the actual rest voltage $U_{00,g}$ by adaptation of the acid densities $r_i$ in the electrolyte balancing areas $S_i$ as follows.

If, for example, the difference between the measured rest voltage and the rest voltage calculated from the model is negative and the rest voltage $U_{00,g}$ is determined solely by the acid density $r_i$ in the central balancing area $S_2$ in the case of a model with three electrolyte balancing areas $S_i$ then the acid density $r_i$ in the second balancing area $S_i$ is reduced. The acid densities $r_i$ in the other balancing areas $S_1$, $S_3$ will have to be adapted on the basis of the boundary conditions:
 a) amount of acid remains constant
 b) acid density $r_i$ rises monotonally from top to bottom, and
 c) specific limit values are not undershot or exceeded.

The method has been verified on the basis of an actual experiment with measurements on a 110 Ah battery. In the process, acid stratification was caused to occur to an ever greater extent in the battery. The experiment was carried out by charging and discharging in steps, with the experiment being started in the discharged state. During the process, the energy storage battery was discharged until the final discharge voltage of 10.5 volts was reached.

The experimental and comparative data are plotted against the observation time t in FIGS. 5 to 10.

Figure 5:
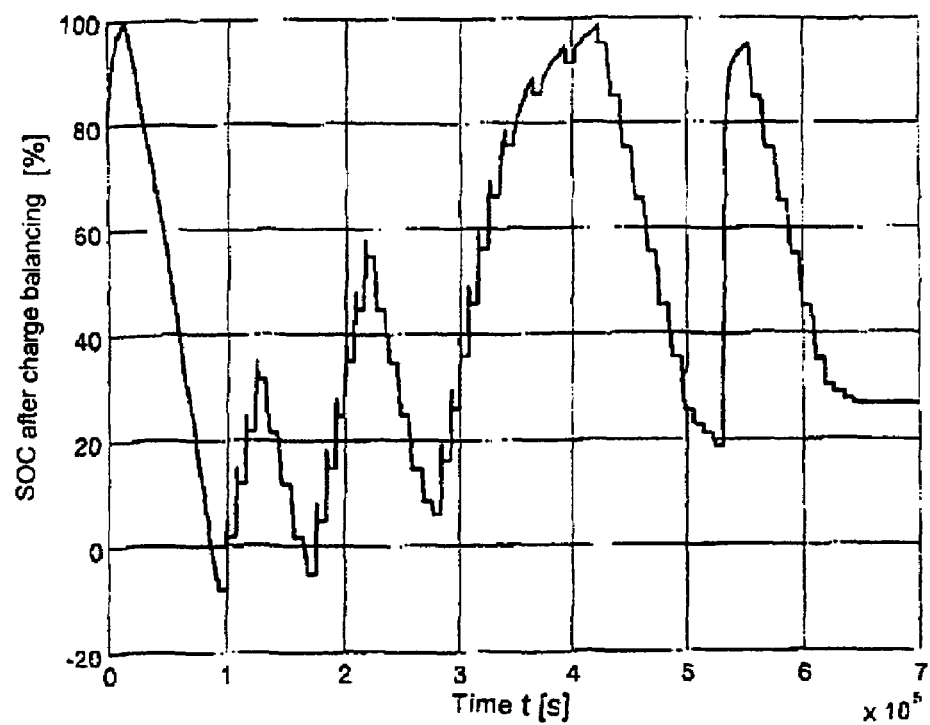
FIG. 5 shows a graph of the state of charge of an energy storage battery, calculated from the charge balance, against time.

FIG. 5 shows the state of charge SOC determined by calculation of the charge throughput. As can be seen, the energy storage battery was discharged and charged in cycles. The discharge cycles can be identified by the falling state of charge SOC, and the charging cycles by the rising state of charge SOC.

Figure 6:
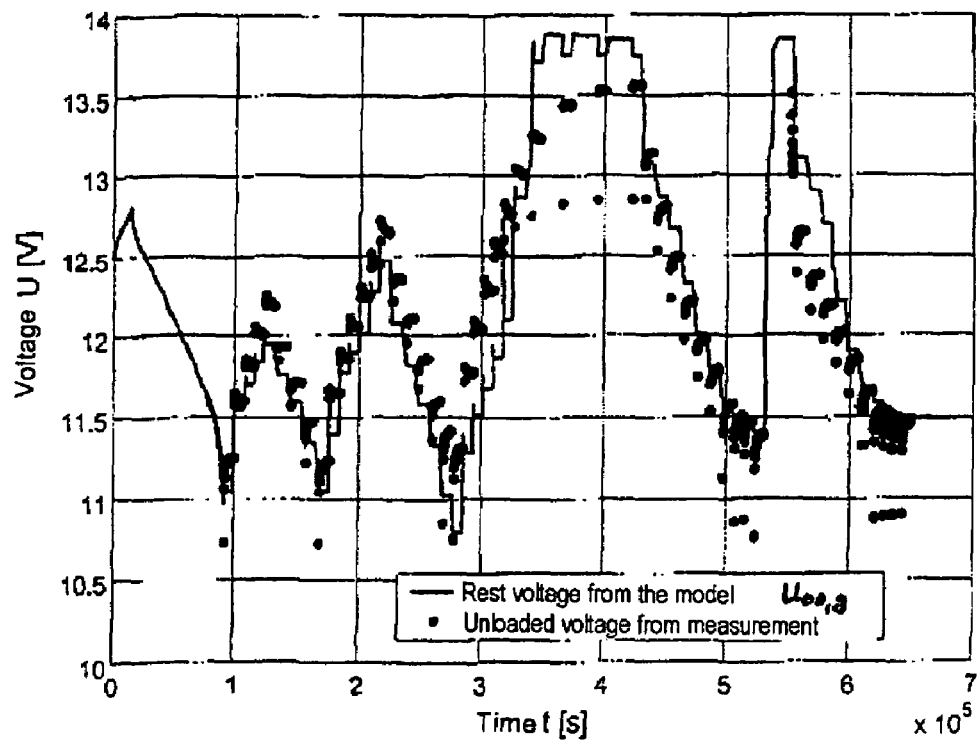
FIG. 6 shows a graph of the rest voltage, calculated from the model of the energy storage battery using the electrical equivalent circuit, and the actually measured unloaded voltage of an energy storage battery, against time.

FIG. 6 shows a comparison of the measured unloaded terminal voltage U of the energy storage battery at zero current (I=0), and of the rest voltage $U_{00,g}$ calculated from the model described above. The measured unloaded voltage U is symbolized by the dots.

Since the unloaded voltage U measured at zero current does not in itself represent the rest voltage $U_{00}$, which does not occur until after a rest phase of several hours, the first measured values in the rest phase are different to the other values. Nevertheless, a good match can be seen between the measurement and the rest voltage calculated from the model.

Figure 7:
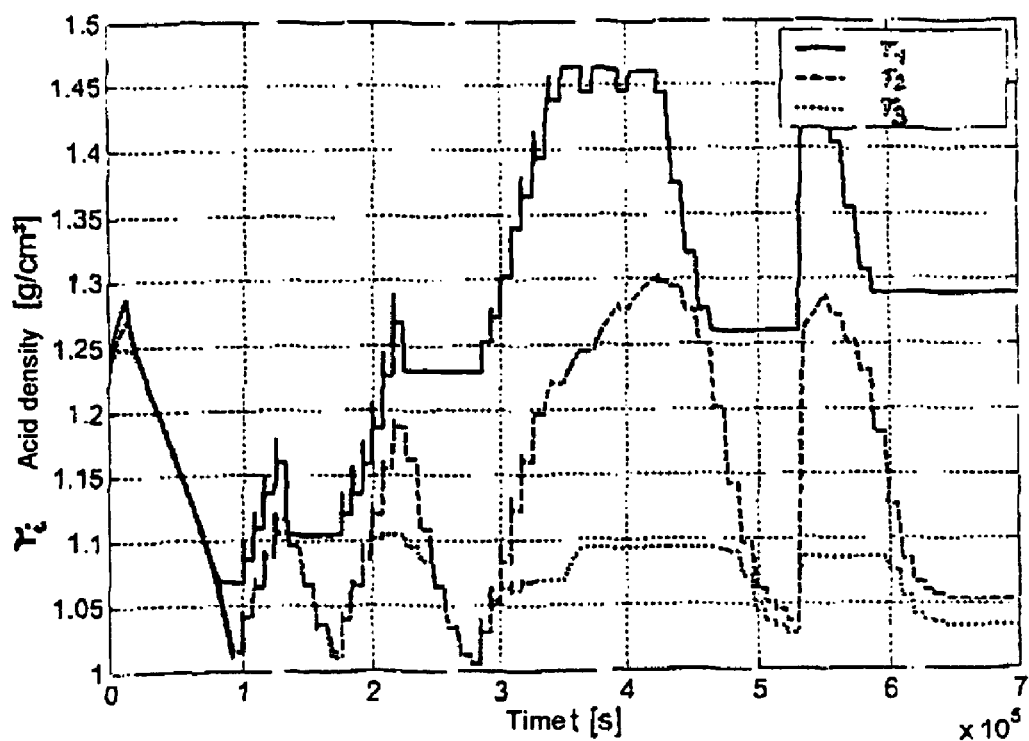
FIG. 7 shows a graph of the acid density in the acid balancing areas of an energy storage battery against time.

FIG. 7 shows the acid densities $r_1$, $r_2$ and $r_3$ calculated for the three electrolyte balancing areas $S_1$, $S_2$ and $S_3$ plotted against time. This clearly shows that the acid density increases more sharply in the charging phase in the lower area, that is to say in the electrolyte balancing area $S_1$, than in the electrolyte balancing areas $S_2$ and $S_3$ above it.

Figure 8:
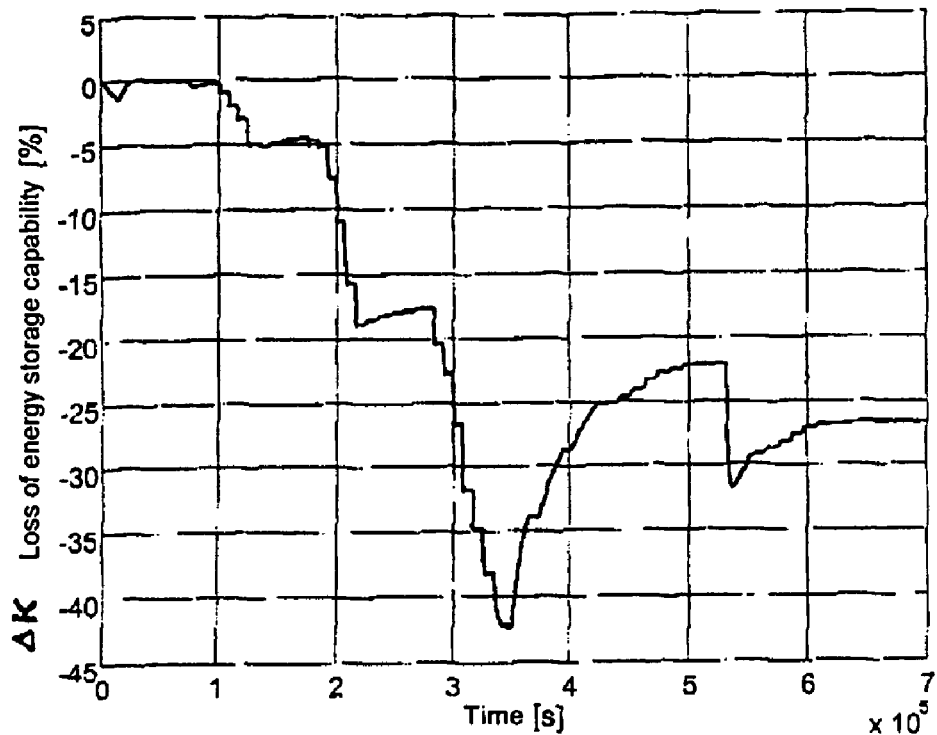
FIG. 8 shows a graph of the loss of energy storage capability of an energy storage battery against time.

FIG. 8 shows the loss of energy storage capacity $\Delta K$ for the theoretical case of full charging. The remaining energy storage capacity at any given time t can in this way be determined from the energy storage capacity K of the energy storage battery when new.

Figure 9:
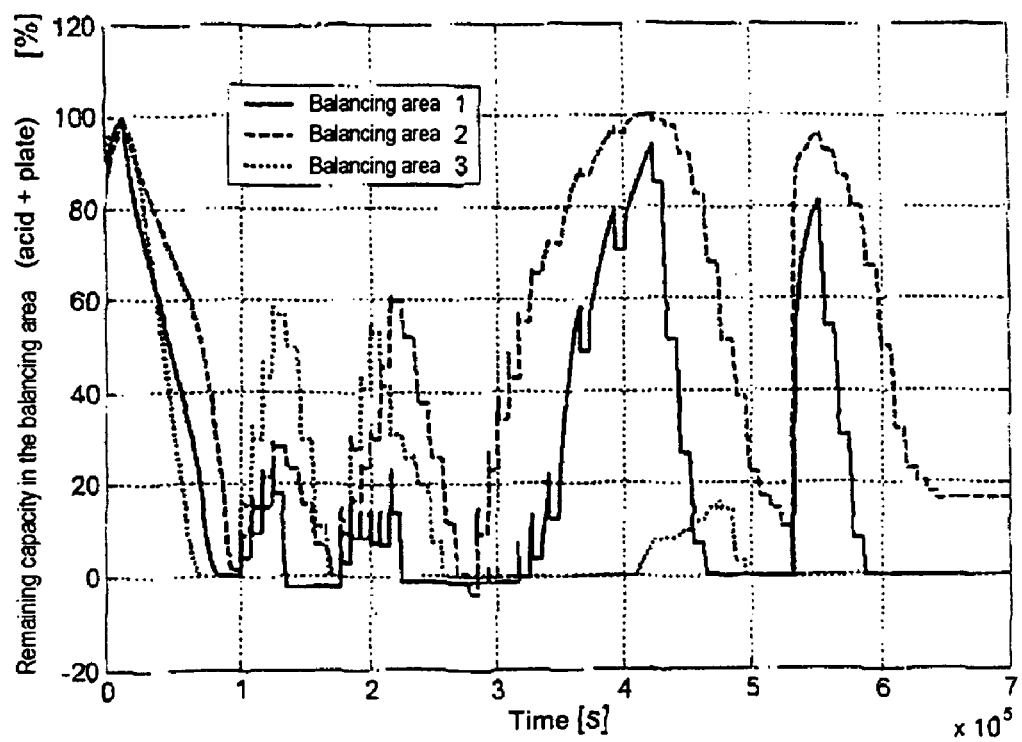
FIG. 9 shows a graph of the remaining capacity in the acid and associated electrode plate balancing areas, against time.

FIG. 9 shows the remaining capacity $RK_k$ which is still available in the individual electrode plate balancing areas $P_k$, plotted against time t. This clearly shows that, in particular, the electrolyte balancing area $S_3$ and the electrode plate balancing area $P_3$ substantially govern the loss of energy storage capacity, since there is virtually no acid here once the balancing areas $S_1$, $S_2$ and $P_1$, $P_2$ have been discharged.

Figure 10:
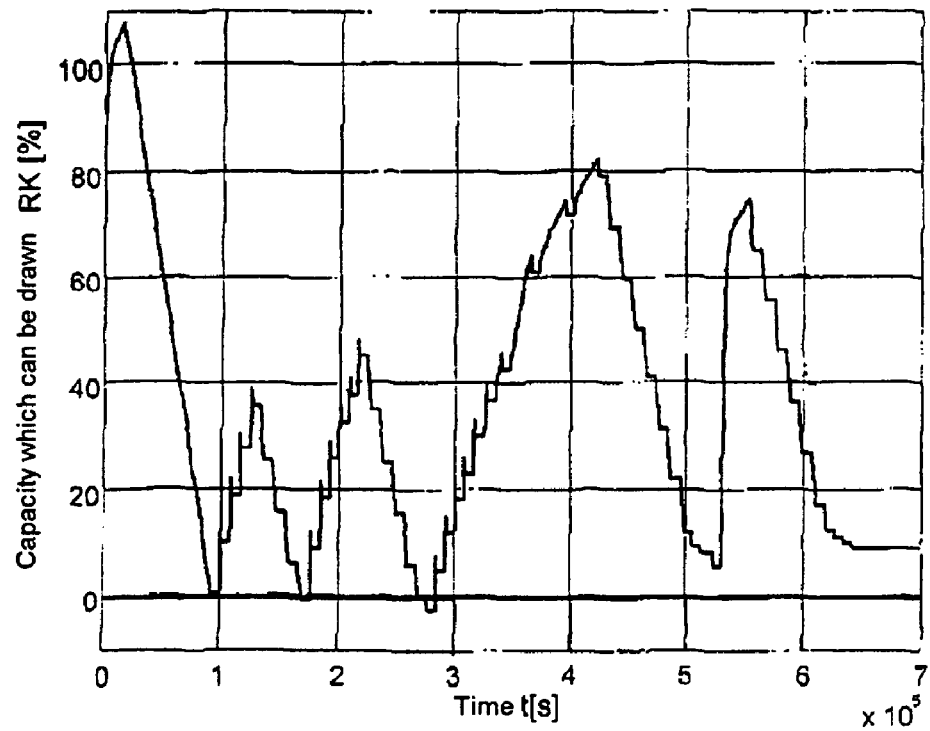
FIG. 10 shows a graph of the energy storage capacity which can be drawn, against time.

FIG. 10 shows the energy storage capacity $RK_g$ which can be drawn as a characteristic variable for the state of the energy storage battery which was calculated from the model described above, against time. In the ideal situation, when the described method is working perfectly, all of the discharge processes end on the zero line. As can be seen, there was an error of about 10%*$RK_g$ only towards the end of the experiment. There is therefore a good match between the model and the measurement.

Furthermore, the measured and calculated variables can be used to predict the high-current behavior and other characteristic variables.

According to an exemplary embodiment, a monitoring device of a generic type may be provided for carrying out the method as described above being formed, for example, by programming of a microprocessor unit. For example, a monitoring device may be provided for an electrochemical energy storage battery having an evaluation unit and a measurement unit for measurement of the battery terminal voltage (U), of the battery terminal current (I) and of the battery temperature (T). The evaluation unit may be designed to carry out a method, preferably by programming of a microprocessor unit.

It is important to note that the various exemplary embodiments are illustrative only. Although only a few embodiments of the present inventions have been described in detail in this disclosure, those skilled in the art who review this disclosure will readily appreciate that many modifications are possible without materially departing from the novel teachings and advantages of the subject matter recited in the claims. Accordingly, all such modifications are intended to be included within the scope of the present invention as defined in the appended claims. The order or sequence of any process or method steps may be varied or re-sequenced according to alternative embodiments. Other substitutions, modifications, changes and omissions may be made in the design, operating conditions and arrangement of the exemplary embodiments without departing from the scope of the present inventions as expressed in the appended claims.

What is claimed is:

1. A method for determining characteristic variables for electrical states of an energy storage battery comprising:
 subdividing an electrolyte volume of the battery into at least two electrolyte volume components with associated electrolyte balancing areas, which are located horizontally one above the other;
 defining at least two electrode plate balancing areas by subdividing the total resistance of electrode plates in the battery into resistance components for the defined electrode plate balancing areas and by subdividing the total energy storage capacity of the electrode plates into energy storage capacity components for the defined electrode plate balancing areas, which are located horizontally one above the other in the same way as the electrolyte balancing areas;
 determining the electrolyte concentration of the electrolyte volume components for the defined electrolyte balancing areas;
 determining the amounts of charge which are held in the electrode plates in each of the electrode plate balancing areas; and
 determining at least one characteristic variable for associated electrical states of the battery using a mathematical model for describing an electrical equivalent circuit which utilizes at least the variables of the resistance components, the energy storage capacity components, the electrolyte concentration, and the amounts of charge held.

2. The method of claim 1 wherein the acid density of the electrolyte volume components is a measure of the electrolyte concentration.

3. The method of claim 1 further comprising determining rest voltages in the defined electrode plate balancing areas as a function of the electrolyte concentration in an associated electrolyte balancing area.

4. The method of claim 3 further comprising determining the rest voltages in the defined electrode plate balancing areas as a function of battery temperature and of the amounts of charge held.

5. The method of claim 1 further comprising calculating currents for the electrolyte balancing areas from the total current flowing to connecting terminals of the battery and from a division ratio which is dependent on the electrolyte concentration in the respective electrolyte balancing area.

6. The method of claim 1 wherein currents for the electrode plate balancing areas are calculated from the total current flowing to the connecting terminals of the battery and from a division ratio which is dependent on rest voltages in the respective electrode plate balancing areas and the resistance components.

7. The method of claim 6 wherein for discharge currents, currents for the electrolyte balancing areas are assumed to be equal to currents calculated for the associated electrode plate balancing areas.

8. The method of claim 1 wherein the amount of charge ($KE_k^M$) held in an electrode plate balancing area after a time period (dt) is calculated from the energy storage capacity held in this electrode plate balancing area until immediately before the time period and the charge ($I_k^M \times dt$) which has flowed through the electrode plate balancing area in the time period according to the formula:

$$KE_k^M(t_1+dt)=KE_k^M(t_1)+I_k^M \cdot dt.$$

9. The method of claim 1 wherein the amount of charge which can still be drawn from the electrode plates in the individual electrode plate balancing areas is calculated from the energy storage capacity component of the respective electrode plate balancing area minus the amount of charge which was drawn from the active mass in the electrode plate balancing area prior to the time period, and minus the charge drawn from the electrode plates in the electrode plate balancing area in the time period.

10. The method of claim 1 further comprising calculating the amounts of charge which can still be drawn from the electrolyte volume components in the individual electrolyte balancing areas as a function of the electrolyte concentration at that time and the electrolyte volume in the respective electrolyte balancing area and the battery temperature.

11. The method of claim 1 further comprising calculating the remaining capacity which can still be drawn from the battery as a characteristic variable as a function of the amounts of charge which have been determined for the electrode plate balancing areas and can still be drawn from the active masses of the respective electrode plate balancing areas, and as a function of the amounts of charge which have been determined for the electrolyte balancing areas and can still be drawn from the electrolyte volume components in the respective electrolyte balancing areas.

12. The method of claim 11 wherein the characteristic variable is determined as a function of the charge reversal current ($I_U$) on the electrode plates between points where the rest voltage ($U_{00,x}$) is relatively high and points where the rest voltage ($U_{00,y}$) is relatively low, with the charge reversal current ($I_U$) being calculated from the polarization resistance ($R_p$) on the electrode plate surfaces and the sum of the grid resistances ($R_n$) between the points (x, y), using the formula:

$$I_U = (U_{00,x} - U_{00,y}) \cdot \left( R_{P,x} + R_{P,y} + \sum_{n=x}^{y} R_n \right).$$

13. The method of claim 12 wherein the rest voltage of the battery is calculated as a characteristic variable as a function of the state of charge of the individual electrode plate balancing areas, of the rest voltages in the electrode plate balancing areas, of the resistance components, of the polarization resistance and of the charge reversal current by reversing the charge on in each case one individual electrode plate.

14. The method of claim 1 further comprising determining the critical temperature for the start of ice crystal formation in the balancing areas as a function of the electrolyte concentration in the electrolyte balancing areas, the temperature, and the electrolyte volume components ($v_i$).

15. The method of claim 14 further comprising determining the ice crystal volume ($v_{ice}$) in the electrolyte balancing areas from a defined relationship between the equilibrium concentration ($CGG_i$) of the acid in the electrolyte and the temperature (T) as well as the acid concentration ($C_i$) in the electrolyte using the formula:

$$v_{ice,i}=(1-C_i/CGG_i) \cdot v_i.$$

16. The method of claim 15 further comprising determining a characteristic variable for the performance of the battery as a function of the proportion of the ice crystal volume to the electrolyte volume in the electrolyte balancing areas and the location at which the ice crystal formation occurs.

17. The method of claim 1 further comprising adapting the state values for the electrolyte concentration in the electrolyte balancing areas as a function of the difference between an actual rest voltage and a calculated rest voltage.

18. The method of claim 1 wherein separate electrolyte balancing areas are assigned to outer areas of the battery and are assessed separately from the other electrolyte balancing areas.

19. A monitoring device for an electrochemical energy storage battery comprising:
 a measurement unit for measurement of the battery terminal voltage, of the battery terminal current and of the battery temperature; and
 an evaluation unit;
 wherein the evaluation unit is designed to carry out a method by programming of a microprocessor unit, the method comprising a method for determining characteristic variables for electrical states of an energy storage battery, the method comprising:
 subdividing an electrolyte volume of the battery into at least two electrolyte volume components with associated electrolyte balancing areas, which are located horizontally one above the other;
 defining at least two electrode plate balancing areas by subdividing the total resistance of electrode plates in the battery into resistance components for the defined electrode plate balancing areas and by subdividing the total energy storage capacity of the electrode plates into energy storage capacity components for the defined electrode plate balancing areas, which are located horizontally one above the other in the same way as the electrolyte balancing areas;

determining the electrolyte concentration of the electrolyte volume components for the defined electrolyte balancing areas;

determining the amounts of charge which are held in the electrode plates in each of the electrode plate balancing areas; and determining at least one characteristic variable for associated electrical states of the battery using a mathematical model for describing an electrical equivalent circuit which utilizes at least the variables of the resistance components, the energy storage capacity components, the electrolyte concentration, and the amounts of charge held.

* * * * *